(12) United States Patent
Toyoda (10) Patent No.: US 7,754,597 B2
(45) Date of Patent: Jul. 13, 2010

(54) BONDING PAD FABRICATION METHOD, METHOD FOR FABRICATING A BONDING PAD AND AN ELECTRONIC DEVICE, AND ELECTRONIC DEVICE

(75) Inventor: Naoyuki Toyoda, Suwa (JP)

(73) Assignee: Seiko Epson Corporation (JP)

( * ) Notice: Subject to any disclaimer, the term of this patent is extended or adjusted under 35 U.S.C. 154(b) by 868 days.

(21) Appl. No.: 11/457,505

(22) Filed: Jul. 14, 2006

(65) Prior Publication Data
US 2007/0023900 A1 Feb. 1, 2007

(30) Foreign Application Priority Data
Jul. 27, 2005 (JP) ............... 2005-216881

(51) Int. Cl.
*H01L 21/44* (2006.01)
*H01L 21/31* (2006.01)
*H01L 21/469* (2006.01)

(52) U.S. Cl. ............ 438/612; 438/617; 438/613; 438/758

(58) Field of Classification Search ........... 438/612, 438/617, 695, 611, 613, 782, 758, 780
See application file for complete search history.

(56) References Cited

U.S. PATENT DOCUMENTS 6,861,370 B1   3/2005  Kasatani
7,416,759 B2*  8/2008  Shintate et al. ............ 427/97.1
7,499,117 B2*  3/2009  Maekawa et al. .............. 349/43
2004/0145858 A1*  7/2004  Sakurada .................... 361/600
2005/0003640 A1*  1/2005  Ushiyama et al. ........... 438/502
2005/0130389 A1*  6/2005  Yamazaki et al. ........... 438/455
2007/0098883 A1   5/2007  Itoh et al.

FOREIGN PATENT DOCUMENTS

| JP | 02-174239 | 7/1990 |
| JP | 05-090327 | 4/1993 |
| JP | 2003-318516 | 11/2003 |
| JP | 2004-172612 | 6/2004 |
| JP | 2004-186668 | 7/2004 |
| JP | 2005-040652 | 2/2005 |
| JP | 2005-056985 | 3/2005 |
| JP | 2005-167274 | 6/2005 |
| JP | 2005-183682 | 7/2005 |
| WO | WO2005-025787 | 3/2005 |

* cited by examiner

*Primary Examiner*—Chuong A. Luu
(74) *Attorney, Agent, or Firm*—Harness, Dickey & Pierce, P.L.C.

(57) ABSTRACT

A method for fabricating a bonding pad 45 includes disposing a droplet L including a liquid containing a conductive material on a substrate P by a droplet ejection method and solidifying the disposed droplet L to forms the pad. The bonding pad 45 formed has a cylindrical shape and includes a concave part 47.

7 Claims, 4 Drawing Sheets

BONDING PAD FABRICATION METHOD, METHOD FOR FABRICATING A BONDING PAD AND AN ELECTRONIC DEVICE, AND ELECTRONIC DEVICE

BACKGROUND

1. Technical Field

The present invention relates to a bonding pad fabrication method, a method for fabricating a bonding pad and an electronic device, and an electronic device.

2. Related Art

In a semiconductor device, a semiconductor device (chip) and a bonding pad as an electrode pad, both disposed on a substrate, are connected by a bonding wire. The bonding wire is made of a conductive material, such as aluminum or gold, and establishes continuity between the semiconductor device (chip) and the bonding pad.

As described in an example below, the bonding pad is made of a conductive material, such as aluminum, and a thin film forming method is used because when forming a film, the method can easily control the thickness of the film.

JP-A-2005-167274 is an example of related art.

However, the method according to JP-A-2005-167274 requires more accurate mask alignment as the shape of the bonding pad becomes minuter. It is troublesome that each substrate requires mask alignment work. The flat bonding pad makes it difficult to apply force to the pad uniformly when bonding a wire to the pad. This may prevent the wire from being properly connected to the bonding pad.

SUMMARY

An advantage of the invention is to provide a bonding pad fabrication method by which a bonding pad can easily be fabricated. Another advantage of the invention is to provide a method for fabricating a bonding pad of good bonding nature and an electronic device. Yet another advantage of the invention is to provide an electronic device.

According to a first aspect of the invention, a bonding pad fabrication method for forming a pad on a substrate includes disposing a droplet including a liquid containing a conductive material on the substrate by a droplet ejection method and forming the pad by solidifying the disposed droplet.

According to the first aspect of the invention, it is possible to easily form a bonding pad by disposing a droplet including a liquid containing a conductive material on a substrate and then solidifying the disposed droplet. Because this method requires no mask alignment unlike a thin film formation method, the fabrication method can be simplified.

It is preferable that the pad be formed in a cylindrical shape in the pad forming step of the bonding pad fabrication method according to the first aspect of the invention.

According to the first aspect of the invention, the cylindrical bonding pad requires less material to form than a hexahedron bonding pad. This is because if the diameter of a circular cross section of the cylindrical pad, is identical in size to one edge of a rectangular cross section of the hexahedron pad, the area of the circle is smaller than that of the rectangle.

In this case, the pad may be formed in a concave shape in the pad forming step of the bonding pad fabrication method according to the first aspect of the invention.

A bonding pad formed in a concave shape according to the first aspect of the invention allows a bonding wire to be disposed stably in the concave part of the bonding pad. This makes it easy to apply force to the bonding pad uniformly when bonding the wire to the pad, allowing the bonding wire to be properly connected to the bonding pad. This facilitates the bonding work and improves productivity.

A bonding pad according to a second aspect of the invention, which is a bonding pad formed on a substrate, includes a pad formed by disposing a droplet including a liquid containing a conductive material by a droplet ejection method on the substrate and then solidifying the disposed droplet.

According to the second aspect of the invention, a bonding pad is formed by a droplet ejection method, providing an easy bonding pad fabrication method.

It is preferable that a bonding pad according to the second aspect of the invention be formed in a cylindrical shape.

According to the second aspect of the invention, the cylindrical bonding pad can save the material compared to a hexahedron bonding pad. This is because if the diameter of a circular cross section of the cylindrical pad is identical in size to one edge of a rectangular cross section of the hexahedron pad, the area of the circle is smaller than that of the rectangle.

It is preferable that the pad according to the second aspect of the invention be formed in a concave shape.

A bonding pad formed in a concave shape according to the second aspect of the invention allows a bonding wire to be disposed stably in the concave part of the bonding pad. This makes it easy to apply force to the bonding pad uniformly when bonding the wire to the pad, allowing the bonding wire to be properly connected to the bonding pad. This facilitates the bonding work, making it possible to provide an electronic device capable of improving productivity.

An electronic device fabrication method according to a third aspect of the invention, which is a method for fabricating an electronic device including a substrate and an element disposed on the substrate and having an electrode, includes forming a bonding pad by disposing a droplet including a liquid containing a conductive material on the substrate by a droplet ejection method and then solidifying the disposed droplet; and connecting the electrode and the bonding pad with a wire.

According to the third aspect of the invention, use of a droplet ejection method allows easy formation of a bonding pad on a substrate, thus improving productivity of an electronic device.

An electronic device according to a fourth aspect of the invention, which is an electronic device including a substrate and an element disposed on the substrate and having an electrode, includes a bonding pad formed by disposing a droplet including a liquid containing a conductive material on the substrate by a droplet ejection method and then solidifying the disposed droplet; and a wire for connecting the electrode and the bonding pad.

According to the fourth aspect of the invention, use of a droplet ejection method allows easy formation of a bonding pad on a substrate, thus providing an electronic device whose productivity can be improved.

BRIEF DESCRIPTION OF THE DRAWINGS

FIGS. 3 A to D are process cross-sectional views showing the fabrication process of a bonding pad according to an embodiment.

FIG. 5 A is a view showing an example of a semiconductor device as an electronic device.

FIG. 5 B is an explanatory drawing of the bonding pad.

DESCRIPTION OF THE EXEMPLARY EMBODIMENTS

Embodiments of a bonding pad fabrication method and a bonding pad according to the present invention will now be described referring to the accompanying drawings. Description will be made using a substrate coated with a function liquid by a droplet ejection method, as an example.

Before describing the characteristic composition and the method of the present invention, description will be made in order regarding a substrate, a droplet ejection method, a droplet ejection device, a surface treatment method, and a bonding pad material used by the droplet ejection method.

Substrate

Various kinds of substrates, such as Si wafer, fused silica, glass, plastic film, and metallic plate, can be used as a substrate for used in the invention. A semiconductor film, metal film, dielectric film, organic film, or the like may be formed as a primary coating on the surface of these substrates.

Droplet Ejection Method

Ejection techniques for a droplet ejection method include the electrification control method, the pressurizing vibration method, the electromechanical conversion method, the electric-thermal conversion method, and the electrostatic suck method. The electrification control method provides electric charge to a material with an electrification electrode, controls the flight direction of the material with a deflecting electrode, and thus ejects the material from an ejection nozzle. The pressurizing vibration method ejects a material from a nozzle tip by applying extra-high voltage of about 30 kg/cm2 to the material. When control voltage is not applied, the material goes straight and is ejected from the ejection nozzle; when control voltage is applied, electrostatic repulsion occurs between materials, dispersing the materials and thus preventing them from being ejected from the ejection nozzle. The electromechanical conversion method utilizes a piezoelectric element's nature of transforming itself by receiving a pulsed electrical signal. In this method, a transformed piezoelectric element gives pressure to a space, which traps a material, through a flexible material, pushes the material out of the space, and thus ejects the material from an ejection nozzle.

The electrothermal conversion method rapidly evaporates a material with a heater installed in a space that traps the material to generate bubbles, and ejects the material in the space using the pressure of the bubbles. The electrostatic suck method applies minute pressure to a space that traps a material, forms meniscus of the material on the ejection nozzle, applies electrostatic attraction under such a condition, and then draws out the material. Techniques such as one that uses a change in the fluid viscosity by the electric field and one that runs off a material by an electrical discharge spark are applicable as well. A droplet ejection method is advantageous in that a material is less likely wasted and that a desired amount of material can precisely be disposed in a desired position. The amount of a drop of a liquid material ejected by a droplet ejection method is, for example, 1 to 300 nanograms.

Droplet Ejection Device

Next, description is made on an example of a droplet ejection device for ejecting a liquid material by the above-mentioned droplet ejection methods. This embodiment will be described showing a droplet ejection device that ejects (drops) a droplet from a droplet ejection head on a substrate by a droplet ejection method.

Figure 1:
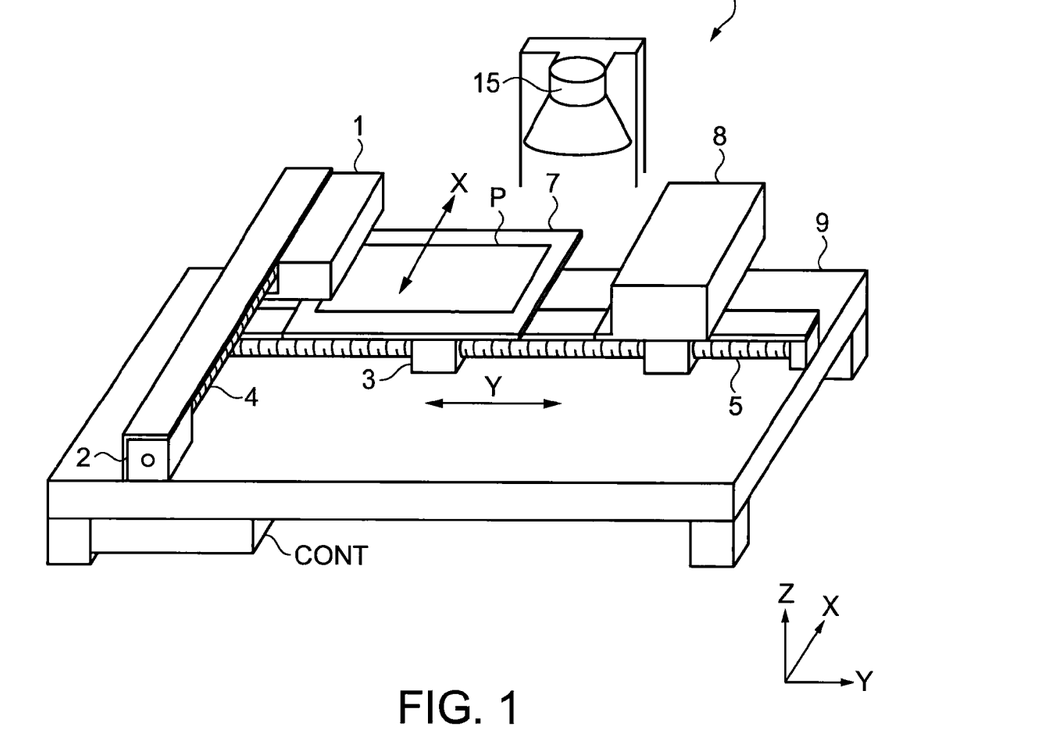
FIG. 1 is a schematic perspective view showing the overall configuration of a droplet ejection device.

FIG. 1 is a perspective view showing a schematic configuration of a droplet ejection device IJ.

The droplet ejection device IJ includes a droplet ejection head 1, an X axis direction drive shaft 4, a Y axis direction guide shaft 5, a controller CONT, a stage 7, a cleaning mechanism 8, a base 9, and a heater 15.

The stage 7 supports a substrate P as a substrate on which a liquid material is disposed by the droplet ejection device IJ, and includes a fixing mechanism (not shown) that fixes the substrate P to a reference position.

The droplet ejection head 1 is a multi-nozzle-type droplet ejection head having multiple ejection nozzles, and makes the longitudinal direction agree with the X axis direction. The multiple ejection nozzles are provided at the bottom of the droplet ejection head 1 at specified intervals. A liquid material is ejected on the substrate P supported by the stage 7 from the ejection nozzles of the droplet ejection head 1.

An X axis direction drive motor 2 is connected to the X axis direction drive shaft 4. The X axis direction drive motor 2 is a stepping motor or the like. Providing a drive signal in the X axis direction from the controller CONT causes the X axis direction drive shaft 4 to rotate. Rotating the X axis direction drive shaft 4 causes the droplet ejection head 1 to move in the X axis direction. The Y axis direction guide shaft 5 is fixed so as not to move relative to the base 9. The stage 7 includes a Y axis direction drive motor 3. The Y axis direction drive motor 3 is a stepping motor or the like. Providing a drive signal in the Y axis direction from the controller CONT causes the stage 7 to move in the Y axis direction.

The controller CONT supplies voltage for controlling droplet ejection to the droplet ejection head 1. The CONT supplies a drive pulse signal for controlling movement of the droplet ejection head 1 in the X axis direction to the X axis direction drive motor 2; and it supplies a drive pulse signal for controlling movement of the stage 7 in the Y axis direction to the Y axis direction drive motor 3.

The cleaning mechanism 8 is used to clean the droplet ejection head 1. The cleaning mechanism 8 includes a Y axis direction drive motor not shown in the figure. Driving the drive motor in the Y axis direction causes the cleaning mechanism 8 to move along the Y axis direction guide shaft 5. Movement of the cleaning mechanism is also controlled by the controller CONT.

The heater 15 is used as a means for heat-treating the substrate P by lamp annealing, and evaporates and dries a solvent contained in a liquid material disposed on the substrate P. Turning on and off of the heater 15 are also controlled by the controller CONT.

The droplet ejection device IJ ejects droplets to the substrate P from the multiple ejection nozzles arranged in the X axis direction at the bottom of the droplet ejection head 1 while relatively moving the droplet ejection head 1 and the stage 7 supporting the substrate P.

Figure 2:
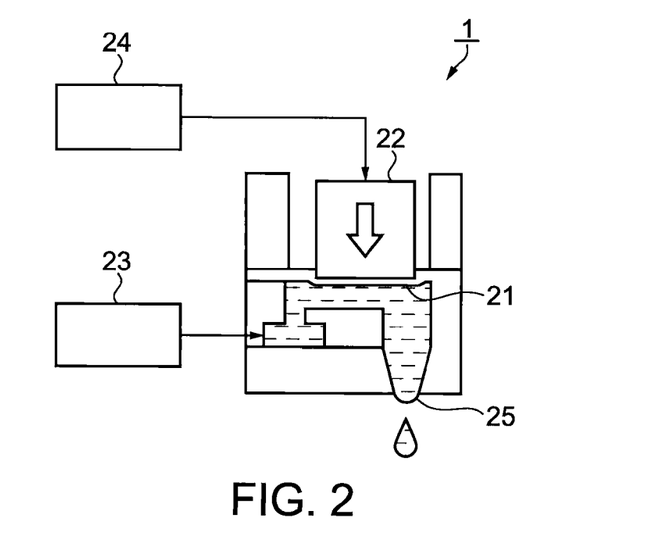
FIG. 2 is a partial perspective view partially showing the principal part of the droplet ejection device.

FIG. 2 is a view illustrating the ejection principle of a liquid material by the piezoelectric method.

In FIG. 2, a piezoelectric element 22 is disposed adjacent to a liquid room 21 accommodating the liquid material. The liquid room 21 is provided with the liquid material through a liquid material supply system 23 including a material tank accommodating the liquid material. The piezoelectric element 22 is connected to a drive circuit 24. The liquid room 21 is transformed by applying voltage to the piezoelectric element 22 through the drive circuit 24 and thus transforming the piezoelectric element 22. When the liquid room 21 restores to its original state, the liquid material is ejected from an ejection nozzle 25. In this case, changing the value of applied voltage controls the distortion amount of the piezoelectric element 22. Changing the frequency of applied voltage controls the distortion speed of the piezoelectric element 22. The droplet ejection by the piezo method has an advantage that it is less likely to affect the composition of the liquid material because it does not apply heat to the liquid material.

The above-mentioned droplet ejection device IJ can be used in any disposition or fabrication method according to the invention. However, the invention is not limited to such a droplet ejection device. It is possible to use any device that can eject a liquid material and make it land in a predetermined position.

Surface Treatment Method

As a surface treatment method according to this embodiment, it is possible to adopt a method that forms an organic thin film on the surface of the substrate P as the liquid repellency treatment for controlling the contact angle of a droplet, a plasma treatment method, or the like. Cleaning is preferably done as a pretreatment process to satisfactorily conduct the liquid repellency treatment. For example, it is possible to adopt ultraviolet cleaning, ultraviolet/ozone cleaning, plasma cleaning, acid/alkali cleaning, or the like.

In a method for forming an organic thin film as the liquid repellency treatment, an organic thin film is formed from organic molecules, such as silane compound and surface active agent, on the surface of the substrate P. An organic molecule for use in the surface treatment of the substrate P includes a functional group that can physically or chemically be coupled to the substrate P and a functional group (for controlling surface energy) that reformulates the surface nature of the substrate P, such as liquid repellent group, on the other side. Such an organic molecule is coupled to the substrate P to form an organic thin film, ideally becoming a single molecule film.

In the plasma treatment method, plasma is irradiated to the substrate P at normal pressure or in the vacuum. A gas for use in the plasma treatment can be selected from various kinds of gases in consideration of the surface material of the substrate P, or the like. A fluorocarbon-based compound can preferably be used as a treatment gas. For example, 4 fluoride methane, perfluorohexane, perfluorodecan, and the like can be exemplified. For example, the treatment conditions of the plasma treatment method ($CF_4$ plasma treatment method) with 4 fluoride methane used as a treatment gas are: the plasma power of 50 to 1000 W; 4 fluoride carbon gas flow of 50 to 100 mL/min; the transportation speed of the substrate P relative to the plasma discharge electrode of 0.5 to 1020 mm/sec; and the temperature of the substrate P of 70 to 90° C.

Bonding Pad Material

A droplet L for forming a bonding pad 45 includes a dispersion liquid in which an conductive corpuscle is dispersed in a dispersion medium or a solution of an organic metallic compound. In this embodiment, gold is used as a conductive corpuscle. Other conductive corpuscles include metal particulates that contain any of silver, copper, iron, tin, aluminum, chrome, manganese, molybdenum, titanium, palladium, indium, antimony, tungsten, and nickel, and their oxides or organic compounds as well as corpuscles of conductive polymers or superconductors. The surface of these conductive corpuscles may be coated with an organic material or the like to improve dispersibility. The particle size of the conductive corpuscle is preferably in the range from 1 nm to 0.1 microns. If the particle size exceeds 0.1 microns, a clogging may occur in the ejection nozzle of the droplet ejection head to be described later. If the particle size is less than 1 nm, the volume ratio of the coating agent to the conductive corpuscles increases, making the percentage of the organic material in the film obtained excessively high.

The abovementioned oxides include ITO and ATO. The abovementioned organic metallic compounds include compounds or complexes that contain gold, silver, copper, palladium, or the like and from which a metal is deposited by pyrolysis. Specifically, chlorotriethyl phosphine Gold (I), chlorotrimethyl phosphine Gold (I), chlorotriphenyl phosphine Gold (I), silver (I) 2,4-pentanedionato complex, trimethyl phosphite (hexafluoroacetyl-acetonato) silver (I) complex, copper (I) hexafluoropentan-dionate-cycloocta-diene complex are among those organic metallic compounds.

As a dispersion medium or solvent, any material that can disperse the abovementioned conductive corpuscles and causes no agglomeration can be used. As well as water, alcohols, such as methanol, ethanol, propanol, and butanol; carbon hydride-based compounds, such as n-heptane, n-octane, decane, dodecane, tetradecane, toluene, xylene, cymene, durene, indene, dipentene, tetrahydronaphthalene, decahydronaphthalene, and cyclohexylbenzene; ether-based compounds, such as ethylene glycol dimethyl ether, ethylene glycol diethyl ether and ethylene glycol methyl ethyl ether, diethylene glycol dimethyl ether, diethylene glycol diethyl ether, diethylene glycol methyl ethyl ether, 1,2-dimethoxyethane, bis (2-methoxyethy) ether, p-dioxane; and polar compounds, such as propylene carbonate, γ-butyrolactone, N-methyl-2-pyrrolidone, dimethylformamide, dimethyl sulfoxide, and cyclohexanone can be illustrated. Among these, water, alcohols, hydrocarbon compounds, and ether compounds are preferable in terms of the dispersion nature of corpuscles and stability of dispersion liquid and the easiness in applying to the droplet ejection method. More preferable dispersion media include water and hydrocarbon compounds.

The surface tension of a dispersion liquid for the abovementioned conductive corpuscle is preferably in the range from 0.02N/m to 0.07N/m. If the surface tension is less than 0.02N/m when the liquid is ejected by a droplet ejection method, a flight bending is likely to occur. This is because the wettability of the compositions of a function liquid for wiring pattern to the ejection nozzle surface is increased. If 0.07N/m is exceeded, ejection control is made difficult because the shape of the meniscus at the tip of the ejection nozzle becomes unstable. To adjust the surface tension, a small amount of fluorine-, silicone-, or nonion-based surface tension adjustment agent may be added to the abovementioned dispersion liquid to an extent that the contact angle of the dispersion liquid with the substrate P is not significantly decreased. A nonion-based surface tension adjustment agent improves the wettability of the liquid and the leveling nature of the film, and helps to prevent occurrence of minute bumps and dips on the film. The abovementioned surface tension adjustment agent may contain an organic compound, such as alcohol, ether, ester, or ketone, if necessary.

The viscosity of the abovementioned dispersion liquid is preferably in the range from 1 mPa·s to 50 mPa·s. If the viscosity of the dispersion liquid is less than 1 mPa·s when ejecting a liquid material as a droplet L by a droplet ejection method, the vicinity of the ejection nozzle is apt to be contaminated due to an outflow of the function liquid for wiring pattern. If the viscosity is more than 50 mPa·s, the flow resistance is raised, making it difficult to eject the droplet L smoothly.

Hereafter, an embodiment of a bonding pad fabrication method, a bonding pad, and an electronic device according to the invention is described in reference to the accompanying drawings.

EMBODIMENT

Bonding Pad Fabrication Method

A method for forming a bonding pad according to this embodiment will now be described. In this embodiment, description is made on a method for forming a cylindrical bonding pad by ejecting a droplet including a conductive material in a droplet shape from an ejection nozzle of a droplet ejection head by a droplet ejection method, disposing the ejected droplet on a substrate subjected to surface treatment, and then solidifying the disposed droplet to form a cylindrical bonding pad.

FIGS. 3A to 3D are process cross-sectional views showing the fabrication process of a bonding pad 45 according to this embodiment. FIG. 4 is a schematic flow chart showing the steps of the fabrication process of the bonding pad 45.

A method for fabricating a bonding pad 45 according to the invention is described referring to FIGS. 3 and 4. The method for forming a bonding pad 45 according to this embodiment generally includes a substrate cleaning step, a substrate surface treatment step, a material disposition step, a drying step, and a solidification step. Hereafter, each step is described in detail.

Substrate Cleaning Process

In step S1 in FIG. 4, a substrate P is cleaned. To conduct the liquid repellency treatment of the substrate P satisfactorily, it is preferable to conduct cleaning as a pretreatment of the liquid repellency treatment. For example, as a method for washing the substrate, it is possible to adopt ultraviolet washing, ultraviolet/ozone washing, plasma washing, acid or alkali cleaning, or the like. An insulating material, for example, Si, is used as a material of the substrate P.

Substrate Surface Treatment Step

Figure 3A:
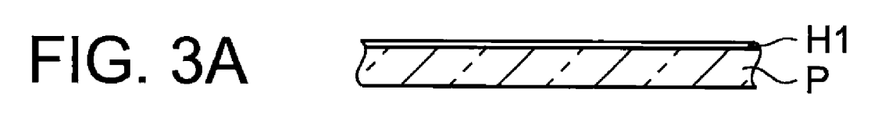
Figure 4:
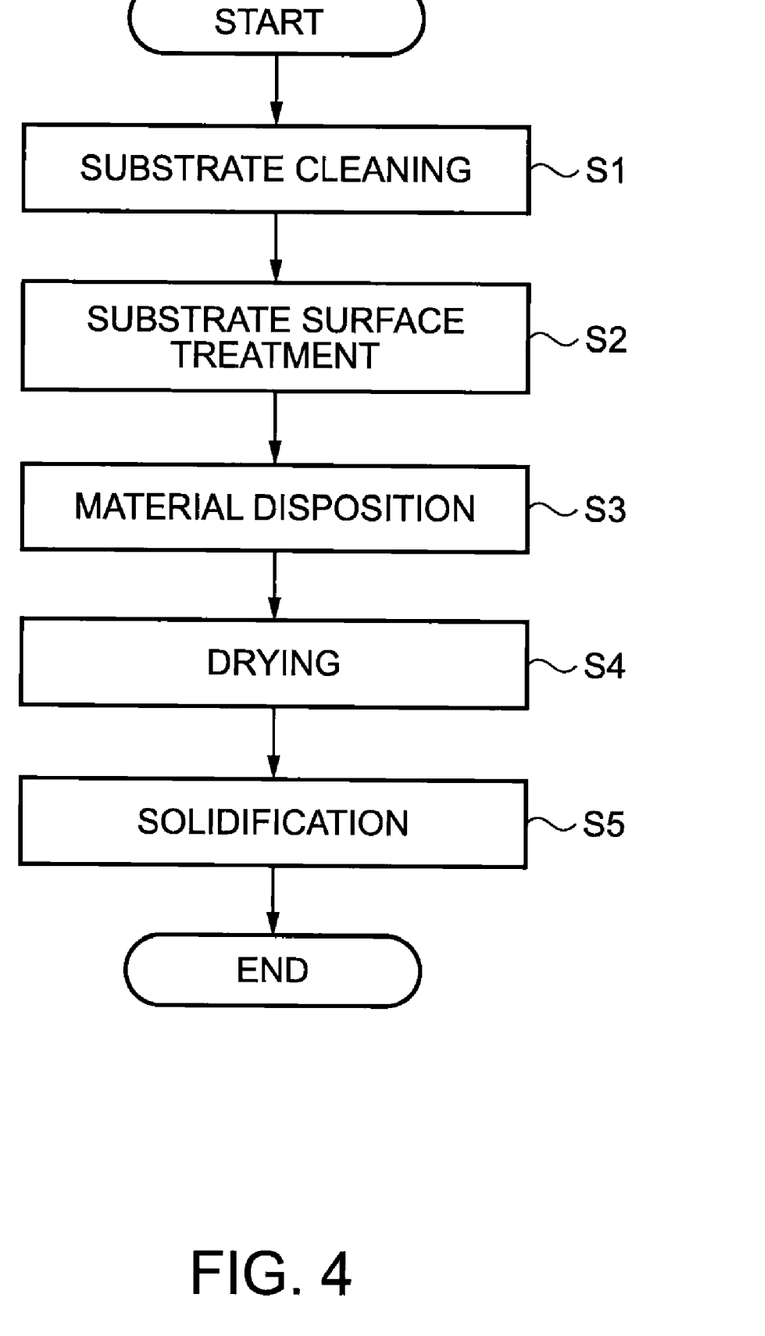
FIG. 4 is a schematic flow chart showing the fabrication process steps of the bonding pad.

In step S2 in FIG. 4, the surface of the substrate P is subjected to surface treatment, as shown in FIG. 3A. The surface treatment of the substrate P is to subject the surface of the substrate P to the liquid repellency treatment so as to obtain a required contact angle to make the landing diameter of a bonding pad material smaller. As a method for subjecting the surface of the substrate P to the liquid repellency treatment, a method for forming an organic thin film on the surface of the substrate P, a plasma treatment method, or the like can be adopted. The method for forming an organic thin film is adopted in this embodiment. Thus, the substrate P obtains liquid repellency and has a liquid repellent layer H1 formed thereon.

Material Disposition Step

Figure 3B:
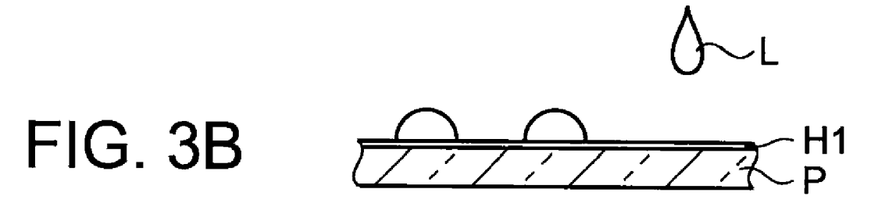

In step S3 in FIG. 4, a droplet L is ejected and disposed as a bonding pad material on the substrate P with a droplet ejection device IJ, as shown in FIG. 3B. For example, gold is used as a conductive corpuscle included in the droplet L. Droplet ejection can be done under the conditions of the droplet weight of 4 ng/dot and the droplet speed (ejection speed) of 5 to 7 m/sec. The atmosphere, to which a droplet is ejected, is preferably to 60° C. or lower for the temperature and 80% or lower for the humidity. Thus, stable droplet ejection can be done without stopping up the ejection nozzle of the droplet ejection head 1. The droplets L may be disposed at a time. They may also be disposed by ejecting droplets multiple times. When the droplets L are disposed on the substrate P, they are formed in hemispheres.

Drying Process

Figure 3C:
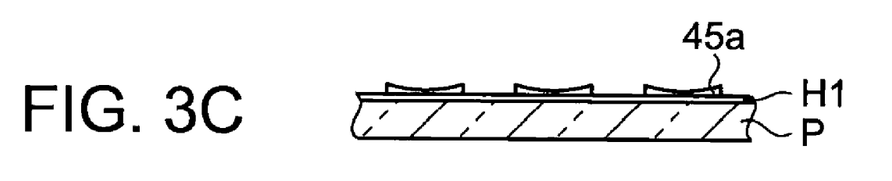

In step S4 in FIG. 4, the droplets L disposed on the substrate P are dried, as shown in FIG. 3(c). After the droplets L are ejected, dispersion media are removed to conduct drying treatment. The droplets L can take peculiar shapes by liquid infiltration. Such peculiar shapes include one with its center part being concave and one having an annular shape. Those shapes are called the "coffee stain phenomenon." As shown in the first example (R. D. Deegan, et. al., Nature, 389, 827 (1997)), those shapes are formed due to a phenomenon in which the solid contents of the droplet converge in the periphery thereof due to the internal convection. According to the second example (R. D. Deegan, et. al., Langmuir, 20, 7789 (2004)), those peculiar shapes are likely to occur as the drying speed of the liquid becomes faster and the viscosity thereof becomes lower. Therefore, these peculiar shapes are apt to be formed as the boiling point of the solvent is lower and the viscosity thereof is lower. To increase the drying speed, drying is preferably conducted under the environment where heating or pressure reduction is carried out to a degree that these peculiar shapes are formed.

Thus, a concave dry film 45a is formed. The inner height of the dried film is lower than its outer height. The dried film 45a is formed in a cylindrical shape whose cross-section is round.

The heating treatment is performed on the substrate P, for example, using a typical hot plate or an electric furnace as well as by lamp annealing. Sources of the light for use in lamp annealing include an IR lamp, a xenon lamp, a YAG laser, an argon laser, a carbon dioxide laser, and excimer lasers, such as XeF, XeCl, XeBr, KrF, KrCl, ArF, and ArCl, but are not limited to those. While the output of those light sources is typically in the range from 10 W to 5000 W, a light source, whose output is in the range from 100 to 1000 W, is satisfactory in this embodiment.

The pressure reduction treatment is carried out with a rotary pump, vacuum pump, turbo pump, or the like. A typical pressure reduction dryer in which any of these pumps is included may be used. It is also possible to combine the pressure reduction treatment with the heating treatment.

In this pressure reduction drying step, drying is achieved under a relatively low vacuum pressure reduction of $10^1$ to $10^4$ Pa. If the vacuum is too high, the solvent may be bumping, making it difficult to obtain the intended shape.

Solidifying Treatment Step

Figure 3D:
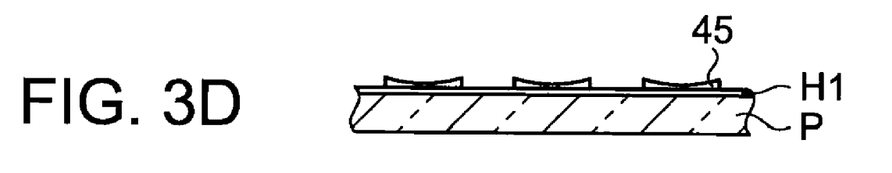

In step S5 in FIG. 4, the dried film 45a after the drying step is subjected to solidification, as shown in FIG. 3D. The dried film 45a must be solidified to improve the mechanical strength at the time of bonding. For this reason, the substrate P after the ejection step is subjected to heat treatment and/or optical treatment. Thus, a bonding pad 45 having a concave part 47 (refer to FIG. 5B) is formed. Because the bonding pad 45 has the concave part 47, its inner height is lower than the outer height. The bonding pad 45 is formed in a cylindrical shape having a round cross-section. Because golden conductive corpuscles are included in the droplet L, the golden bonding pad 45 is formed. Because gold is a softer and more conductive material than aluminum and the like, a bonding wire 46 is preferably bonded to the golden bonding pad 45 (refer to FIG. 5B).

The heat treatment and/or optical treatment are usually done in the atmosphere. Those treatments can be done in an inert gas atmosphere, such as nitrogen, argon, and helium, if necessary. The conditions of heat treatment and/or optical treatment are properly determined considering the boiling point of the solvent (vapor pressure), the kind and pressure of the atmosphere gas, the reaction temperature or reaction exposure amount of the polymerization initiator agent, the reaction temperature and reaction exposure amount of the crosslinking reaction, the glass transfer temperature of the oligomer or polymer, the heatproof temperature of the substrate, and the thermal behavior of the corpuscles, such as distributivity or oxidation.

The dried film 45a after the drying step can be solidified using ultraviolet rays, far ultraviolet rays, electron beams, X-rays, or the like in the optical treatment. In any case, 1 J/cm2 or less is preferable, and 0.2 J/cm2 or less is more preferable to improve productivity. The heat treatment is carried out by a hot plate, an electric furnace, or the like as well as by lamp annealing. If the heat treatment is carried out below the glass-transition temperature of the object to be solidified, it is preferably done at a temperature of 200° C. or less. When the dried film is overheated at the glass-transition temperature or higher, it may be transformed by thermal sagging.

Electronic Device

Figure 5A:
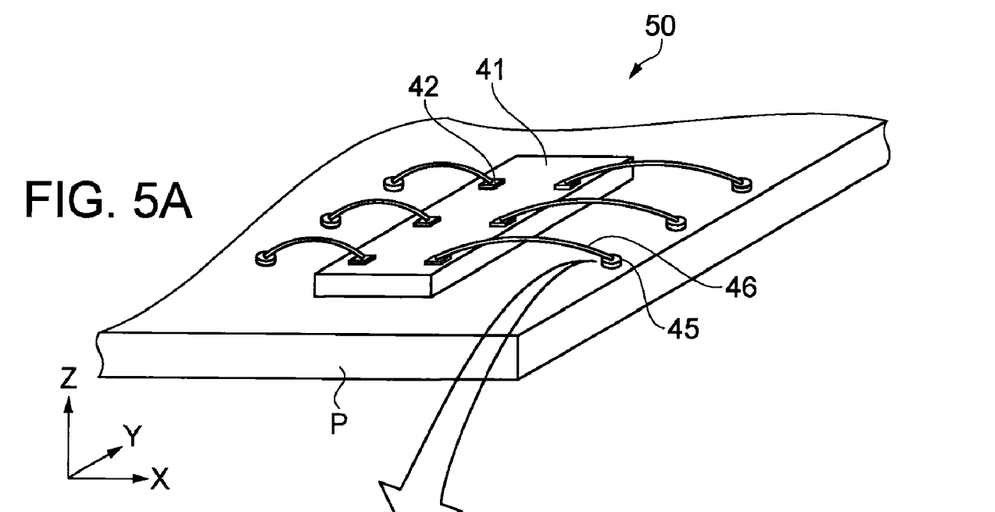
Figure 5B:
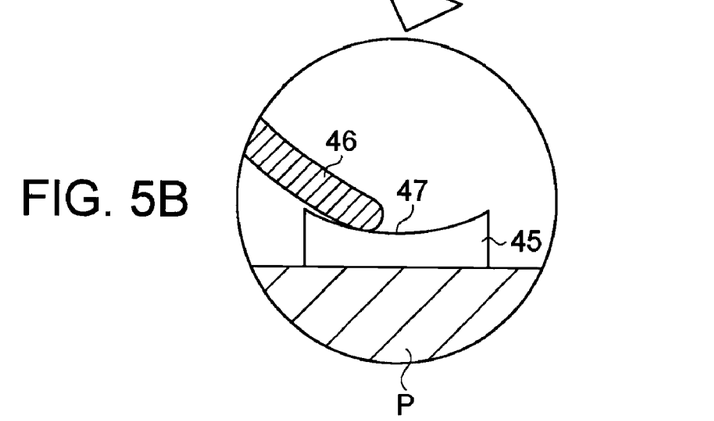

FIG. 5A is a view showing an example of a semiconductor device 50 as an electronic device according to this embodiment. FIG. 5B is an explanatory drawing of the bonding pad 45.

On a substrate P, a semiconductor device 41 is disposed and a plurality of bonding pads 45 are formed, as shown in FIG. 5A. The bonding pad 45 has a cylindrical shape. A plurality of electrode pads 42 are formed on the semiconductor device 41, and the electrode pads 42 and the bonding pads 45 are connected by bonding wires 46. The bonding pads 45 are connected to a drive circuit not shown in the figure, and are configured so that the semiconductor device 41 is driven.

The bonding pad 45 formed on the substrate P has a concave cross-section, and includes a concave part 47, as shown in FIG. 5B. The inner part of the bonding pad 45 is lower than its outer part. A line-shaped bonding wire 46 is disposed on the concave part 47. The bonding wire 46 has a thin line shape whose cross-section is round. The bonding wire 46 is stably disposed on the concave part 47 without causing displacement.

Both the bonding pad 45 and the electrode pad 42 are made of gold. The bonding wire 46 is made of aluminum. The bonding wire 46 may not be necessarily made of aluminum. It is possible to use any material that establishes continuity of the electrode pad 42 and the bonding pad 45. Other materials, such as gold, silver, and copper, may be used.

Brief description is made on a method for forming a semiconductor device 50 as an electronic device by bonding a bonding electrode pad 42 and a bonding pad 45 referring to FIG. 5A.

A semiconductor device 4 including electrode pads 42 is disposed on a substrate P including bonding pads 45. Next, the bonding wire 46 is bonded by disposing the bonding wire 46 on the bonding pad 45 having a concave part 47. Next, a bonding wire 46 is bonded by disposing the bonding wire 46 on an electrode pad 42 on the semiconductor device 41. Such bonding work is repeated with a necessary frequency to form an electronic device 50 as a semiconductor device. The concave shape of the concave part 47 allows the bonding wire 46 having a round line shape to be stably disposed on the concave part 47 compared with a flat shape. Thus, the force is apt to be applied uniformly when bonding the bonding wire 46, allowing the bonding wire 46 to be properly connected to the bonding pad 45. Therefore, the bonding work is facilitated. The bonding pad capable of improving productivity allows supply of the semiconductor device 50 as an electronic device capable of improving productivity.

The semiconductor device 50 as an electronic device including the bonding pad 45 according to the present invention can be applied to, for example, an IC for driving a liquid crystal for use in a liquid crystal device. The semiconductor device 50 is also applicable to arbitrary electro-optic devices other than liquid crystal devices, for example, an optical device using an EL (electroluminescence) device as an electronic optical substrate, and general electro-optic devices, such as plasma display (PDP) and field emission display (FED).

In this embodiment, the following effects are achieved.

(1) It is possible to easily form the bonding pad 45 by disposing the droplet L including a liquid containing a conductive material on the substrate P and solidifying the disposed droplet. This method requires no mask unlike the thin film formation method, making the fabrication process simple and economical.

(2) The cylindrical bonding pad 45 requires less material to form than a hexahedron bonding pad, allowing saving of the material. This is because if the diameter of a circular cross section of the cylindrical pad is identical in size to one edge of a rectangular cross section of the hexahedron pad, the area of the circle is smaller than that of the rectangle.

(3) A bonding pad 45 formed in a concave shape allows a bonding wire to be disposed stably in the concave part 47 of the bonding pad 45. This makes it easy to apply force uniformly when bonding the bonding wire 46, allowing the bonding wire 46 to be properly connected to the bonding pad 45. This facilitates the bonding work and improves productivity.

(4) Because the bonding pad 45 is formed by the droplet ejection method, it is possible to provide the bonding pad 45 whose fabrication method is easy. Since the fabrication method is used in which the bonding pad 45 can easily be fabricated, the productivity of the electronic device 50 is improved.

The present invention has been described showing a preferable embodiment, but is not limited to the above-mentioned embodiment. The invention can be set to any other concrete structure or shape in the scope in which the object of the invention can be achieved, including modifications to be described later.

Modification 1

In the above-mentioned embodiment, the cylindrical boding pad 45 having the concave part 47 is formed using the coffee stain phenomenon, but the invention is not limited to the embodiment. For example, the concave part 47 may not be formed on the bonding pad 45. Even though the bonding pad 45 without the concave part 47 is formed, the similar effect to that of the embodiment is achieved because the cylindrical bonding pad 45 is formed by the droplet ejection method.

Modification 2

In the above-mentioned embodiment, Si having an insulative property is used as the material of the substrate P, but the invention is not limited to the embodiment. For example, it is possible to select a conductive material as the material of the substrate 9, dispose an insulating material by a droplet ejection method, and solidifying the disposed material. It is also possible to dispose an insulating film on a conductive substrate P and then form a bonding pad 45 on the substrate P. Even though the bonding pad 45 is formed in such a manner, the similar effect to that of the embodiment is achieved because the cylindrical bonding pad 45 is formed by the droplet ejection method.

Modification 3

In the above-mentioned embodiment, the cylindrical bonding pad 45 is formed on the substrate P, but this invention is not limited to the embodiment. For example, a bonding pad 45 having an oval cross-sectional shape may be used. Even though the bonding pad 45 formed has such a cross-sectional shape, the similar effect to that of the embodiment can be achieved because the bonding pad 45 formed has a cylindrical shape by the droplet ejection method.

Modification 4

In the above-mentioned embodiment, the cylindrical bonding pad 45 is formed on the substrate, but this invention is not limited to the embodiment. For example, a bonding pad 45 having both circular and oval cross-sectional shapes may be used. Even though the bonding pad 45 formed has such cross-sectional shapes, the similar effect to that of the embodiment can be achieved because the columnar bonding pad 45 is formed by the droplet ejection method.

What is claimed is:

1. A bonding pad fabrication method for forming a pad on a substrate, comprising:
    disposing a droplet including a liquid containing a conductive material on the substrate by a droplet ejection method; and
    solidifying the disposed droplet to form the pad, the pad having a concave portion such that peripheral edges of the pad have a height greater than a height of a central portion of the pad.

2. The bonding pad fabrication method according to claim 1, wherein the pad is formed in a cylindrical shape in the pad formation step.

3. A bonding pad formed on a substrate, comprising:
    a pad having a concave portion such that peripheral edges of the pad have a height greater than a height of a central portion of the pad, wherein said pad is formed by disposing a droplet including a liquid containing a conductive material on the substrate by a droplet ejection method and then solidifying the disposed droplet.

4. The bonding pad according to claim 3, wherein the pad is formed in a cylindrical shape.

5. The bonding pad according to claim 3, wherein the pad is formed in a concave shape.

6. A method for fabricating an electronic device including a substrate and a device disposed on the substrate and having an electrode, comprising:
    forming a bonding pad having a concave portion such that peripheral edges of the bonding pad have a height greater than a height of a central portion of the bonding pad by disposing a droplet including a liquid containing a conductive material on the substrate by a droplet ejection method and then solidifying the disposed droplet; and
    connecting the electrode and the bonding pad with a wire.

7. An electronic device including a substrate and a device disposed on the substrate and having an electrode, comprising:
    a bonding pad having a concave portion such that peripheral edges of the bonding pad have a height greater than a height of a central portion of the bonding pad formed by disposing a droplet including a liquid containing a conductive material on the substrate by a droplet ejection method and then solidifying the disposed droplet; and
    a wire for connecting the electrode and the bonding pad.

* * * * *